(12) United States Patent
Lee et al.

(10) Patent No.: US 9,520,514 B2
(45) Date of Patent: Dec. 13, 2016

(54) QUANTUM DOT INFRARED PHOTODETECTOR

(71) Applicant: National Taiwan University, Taipei (TW)

(72) Inventors: Si-Chen Lee, Taipei (TW); Jheng-Han Lee, Taipei (TW); Zong-Ming Wu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 53 days.

(21) Appl. No.: 13/915,497

(22) Filed: Jun. 11, 2013

(65) Prior Publication Data

US 2014/0361249 A1    Dec. 11, 2014

(51) Int. Cl.
  *H01L 27/146*  (2006.01)
  *H01L 31/0352*  (2006.01)

(52) U.S. Cl.
  CPC . *H01L 31/035218* (2013.01); *H01L 27/14652* (2013.01); *H01L 27/14694* (2013.01); *H01L 31/0352* (2013.01)

(58) Field of Classification Search
  CPC ............. H01L 27/146; H01L 27/14652; H01L 27/14694; H01L 27/14601; H01L 31/035; H01L 31/0352; H01L 31/035218
  See application file for complete search history.

(56) References Cited

U.S. PATENT DOCUMENTS

| 6,239,449 | B1 * | 5/2001 | Fafard et al. | 257/17 |
| 6,774,014 | B1 * | 8/2004 | Lee et al. | 438/478 |
| 2003/0047752 | A1 * | 3/2003 | Campbell | H01L 31/107 257/186 |
| 2003/0170927 | A1 * | 9/2003 | Holonyak et al. | 438/47 |
| 2004/0183062 | A1 * | 9/2004 | Tang | B82Y 10/00 257/14 |
| 2004/0201009 | A1 * | 10/2004 | Hsu | B82Y 10/00 257/21 |
| 2005/0077539 | A1 * | 4/2005 | Lipson | B82Y 10/00 257/186 |
| 2005/0082520 | A1 * | 4/2005 | Fathimulla et al. | 257/14 |
| 2005/0211873 | A1 * | 9/2005 | Krishna et al. | 250/206 |
| 2005/0211996 | A1 * | 9/2005 | Krishna et al. | 257/85 |

(Continued)

FOREIGN PATENT DOCUMENTS

| CN | 102623523 A | 8/2012 |
| TW | 201010105 A | 3/2010 |
| WO | WO2008011152 | * 1/2008 |

*Primary Examiner* — Thomas L Dickey
*Assistant Examiner* — Fazli Erdem
(74) *Attorney, Agent, or Firm* — Huffman Law Group, PC

(57) ABSTRACT

A quantum dot infrared photodetector (QDIP) that can enhance the photocurrent to a greater level than the dark current and/or can be operated at high temperatures is disclosed. The quantum dot infrared photodetector comprises at least one quantum well stack and a plurality of quantum dot layers. The quantum well stack is disposed between the pluralities of quantum dot layers. The quantum well stack comprises two spacer layers and a carrier supplying layer. The carrier supplying layer is disposed between the spacer layers. When the quantum dot infrared photodetector is applied with two bias voltages respectively, the carrier supplying layer supplies carriers to the quantum dot layers.

19 Claims, 7 Drawing Sheets

(56) References Cited

U.S. PATENT DOCUMENTS

| | | | | |
|---|---|---|---|---|
| 2006/0054880 | A1* | 3/2006 | Krishna | B82Y 10/00 257/14 |
| 2007/0131923 | A1* | 6/2007 | Uchiyama | B82Y 20/00 257/14 |
| 2007/0215858 | A1* | 9/2007 | Uchiyama et al. | 257/17 |
| 2007/0262292 | A1* | 11/2007 | Matsukura | B82Y 10/00 257/9 |
| 2008/0073743 | A1* | 3/2008 | Alizadeh | B82Y 10/00 257/461 |
| 2008/0212631 | A1* | 9/2008 | Takeuchi | B82Y 20/00 372/45.01 |
| 2008/0238299 | A1* | 10/2008 | Cho | B82Y 20/00 313/503 |
| 2009/0095349 | A1* | 4/2009 | Forrest | B82Y 30/00 136/262 |
| 2009/0127542 | A1* | 5/2009 | Sugaya | B82Y 10/00 257/24 |
| 2010/0006143 | A1* | 1/2010 | Welser | B82Y 20/00 136/255 |
| 2010/0117060 | A1* | 5/2010 | Wang | B82Y 20/00 257/21 |
| 2010/0123120 | A1* | 5/2010 | Mohseni | 257/21 |
| 2010/0289061 | A1* | 11/2010 | Matsukura | 257/189 |
| 2013/0146844 | A1* | 6/2013 | Sugizaki et al. | 257/21 |
| 2014/0319637 | A1* | 10/2014 | Nakajima et al. | 257/432 |

* cited by examiner

QUANTUM DOT INFRARED PHOTODETECTOR

BACKGROUND

1. Field of the Disclosure

The present disclosure relates to a quantum dot infrared photodetector, for example, to a quantum dot infrared photodetector with a well in dot structure.

2. Description of the Related Art

Infrared photodetectors are widely used in military and astronomy applications. In recent years, t research has been devoted to the development of quantum dot infrared photodetectors (QDIP), because QDIPs exhibit better performance characteristics than traditional quantum well infrared photodetectors (QWIP). For example, QDIPs have an intrinsic sensitivity to the normal incident light, whereas QWIPs cannot absorb normal incident light, are able to operate in higher temperatures, and have a longer lifetime, etc.

Operability at high temperatures is important for infrared photodetectors to cut cooling system costs and expand their applicability. Due to the rapid increase of dark current, which is proportional to $$\exp^{-\frac{1}{kT}},$$

QDIPs are often difficult to operate at high temperatures (>200 K or approximate to room temperature). In order to achieve high-temperature operation, various methods have been applied to try to reduce the dark current. For example, a AlGaAs blocking layer, a tunneling barrier QDIP (T-QDIP), or a confinement enhancing layer formed on the quantum dot layer may be used to reduce the dark current and enhance the operation temperature of QDIPs. However, a complicated and precise epitaxial process is needed to obtain high responsivity and detectivity at high temperature.

More particularly, for standard undoped-InAs QDIPs, the photocurrent of QDIPs results from carries in the QDs supplied from the $n^+$ top and bottom contacts and then swipes by the bias voltage. However, the efficiency of the carrier injection into the QD layer further away from the contacts is low.

Because of the above-mentioned reasons, the development of QDIPs infrared photodetectors that are operable to avoid severe dark current and enhance the photocurrent are desired.

SUMMARY

According to some embodiments, the present disclosure provides a quantum dot infrared photodetector (QDIP) that can enhance the photocurrent to a greater level than the dark current and can be operated at high temperatures.

In one embodiment, the QDIP comprises two contact layers, a plurality of quantum dot layers, and at least one quantum well stack. The two contact layers may be located opposite each other. A plurality of quantum dot layers may be disposed between contact layers. The at least one quantum well stack may be disposed between the quantum dot layers. The quantum well stack may comprise two spacer layers and a carrier supplying layer, wherein the carrier supplying layer may be disposed between the two spacer layers. When the contact layers are applied with two bias voltages, respectively, the carrier supplying layer supplies carriers to the quantum dot layers.

Therefore, the operation temperature, according to some embodiments of the present disclosure, could be raised for varied applicability.

The foregoing is a summary and shall not be construed to limit the scope of the claims. The operations and devices disclosed herein may be implemented in a number of ways, and such changes and modifications may be made without departing from this disclosure and its broader aspects. Other aspects, inventive features, and advantages of the disclosure, as defined solely by the claims, are described in the non-limiting detailed description set forth below.

DETAILED DESCRIPTION

Figure 1:
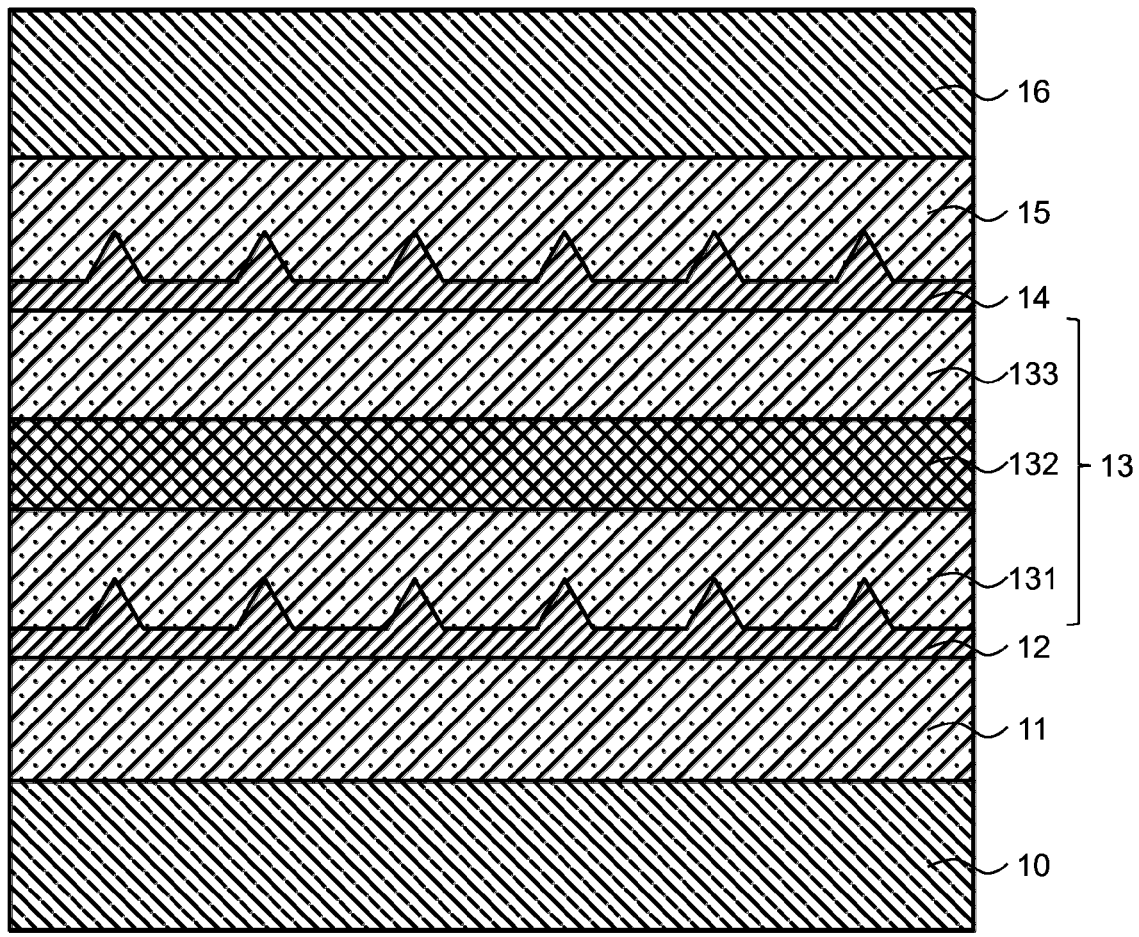
FIG. 1 depicts a schematic view of a QDIP, in accordance with an example embodiment of the present disclosure.

The following description is of the best-contemplated mode of carrying out the disclosure. This description is made for the purpose of illustrating the general principles of the disclosure and should not be taken in a limiting sense. The scope of the invention is best determined by reference to the appended claims.

Reference will be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being "on" another layer or "on" a substrate, it may be directly on the other layer or on the substrate, or intervening layers may also be present.

Referring now to the figures, FIG. 1 depicts a schematic view of a QDIP 1, in accordance with an example embodiment of the present disclosure. The QDIP 1 comprises a bottom contact layer 10, a first quantum dot layer 12, a second quantum dot layer 14, a quantum well stack 13, two second spacer layers 11, 15, and a top contact layer 16. The bottom contact layer 10 may be disposed on a substrate (not shown). The second spacer layer 11 may be disposed on the bottom contact layer 10. The first quantum dot layer 12 may be disposed on the second spacer layer 11. The quantum well stack 13 may be disposed on the first quantum dot layer 12. The second quantum dot layer 14 may be disposed on the quantum well stack 13. The second spacer layer 15 may be disposed on the second quantum dot layer 14. The top contact layer 16 may be disposed on the second spacer layer 15. The quantum well stack 13 may comprise two first spacer layers 131, 133, and a carrier supplying layer 132. The first spacer layer 131 may be disposed on the first quantum dot layer 12. The carrier supplying layer 132 may be disposed on the first spacer layer 131. The first spacer layer 133 may be disposed on the carrier supplying layer 132.

During the actual implementation, the QDIP 1 may comprise only one of the first quantum dot layer 12 and the second quantum dot layer 14 disposed at one side of the quantum well stack 13. The bottom contact layer 10 and the top contact layer 16 may be applied with a positive bias voltage and a negative bias voltage, respectively, and the polarity of the bias voltages can be exchanged to obtain the opposite direction of current.

According to one embodiment, the carrier supplying layer 132 may be doped with n-type dopants, such as Si dopants, in which the concentration of the Si dopants may be between about $9 \times 10^{17}$ cm$^{-3}$ and $1 \times 10^{16}$ cm$^{-3}$. The material of the carrier supplying layer 132 may comprise InGaAS, GaAs, InGaAsP, or AlInGaAs. The thickness of the carrier supplying layer 132 may be between about 8 nm and 12 nm The first spacer layers 131, 133 and the second spacer layers 11, 15 may be identical and may be made of either undoped GaAs or InGaAs. The thickness of each of the spacer layers 131, 133, 11, 15 may be between about 45 nm and 55 nm. Each of the first and second quantum dot layers 12, 14 may be between about 2.2 ML and 2.7 ML and may be made of InAs or InGaAs. The bottom contact layer 10 and the top contact layer 16 may be doped with n-type dopants, such as Si dopants. The material of the contact layers 10, 16 may comprise GaAs, InGaAsP, or InAlGaAs. The thickness of the bottom contact layer 10 may be between about 700 nm and 900 nm The thickness of the top contact layer 16 may be between about 150 nm and 250 nm.

In the present embodiment, the quantum well stack 13 may comprise the doped carrier supplying layer 132 cladded and surrounded by two undoped spacer layers 131, 133, and the conduction energy band edge alignment of the carrier supplying layer 132 may be higher than the conduction energy band edge alignments of the quantum dot layers 12, 14. When the contact layers 10, 16 are applied with two bias voltages, the carrier supplying layer 132 may supply carriers to the quantum dot layers 131, 133, such that the photocurrent may be increased more than the dark current.

In one embodiment, the quantum well stack 13 may be disposed in the middle of three, five, or ten stacks of the second spacer layer 11/first quantum dot layer 12 and three, five, or ten stacks of the second quantum dot layer 14/second spacer layer 15.

In one embodiment, the QDIP 1 may further comprise at least one blocking layer disposed between the bottom contact layer 10 and the second spacer layer 11, or between the top contact layer 16 and the second spacer layer 15. The material of the to blocking layer may be AlGaAs.

Figure 2:
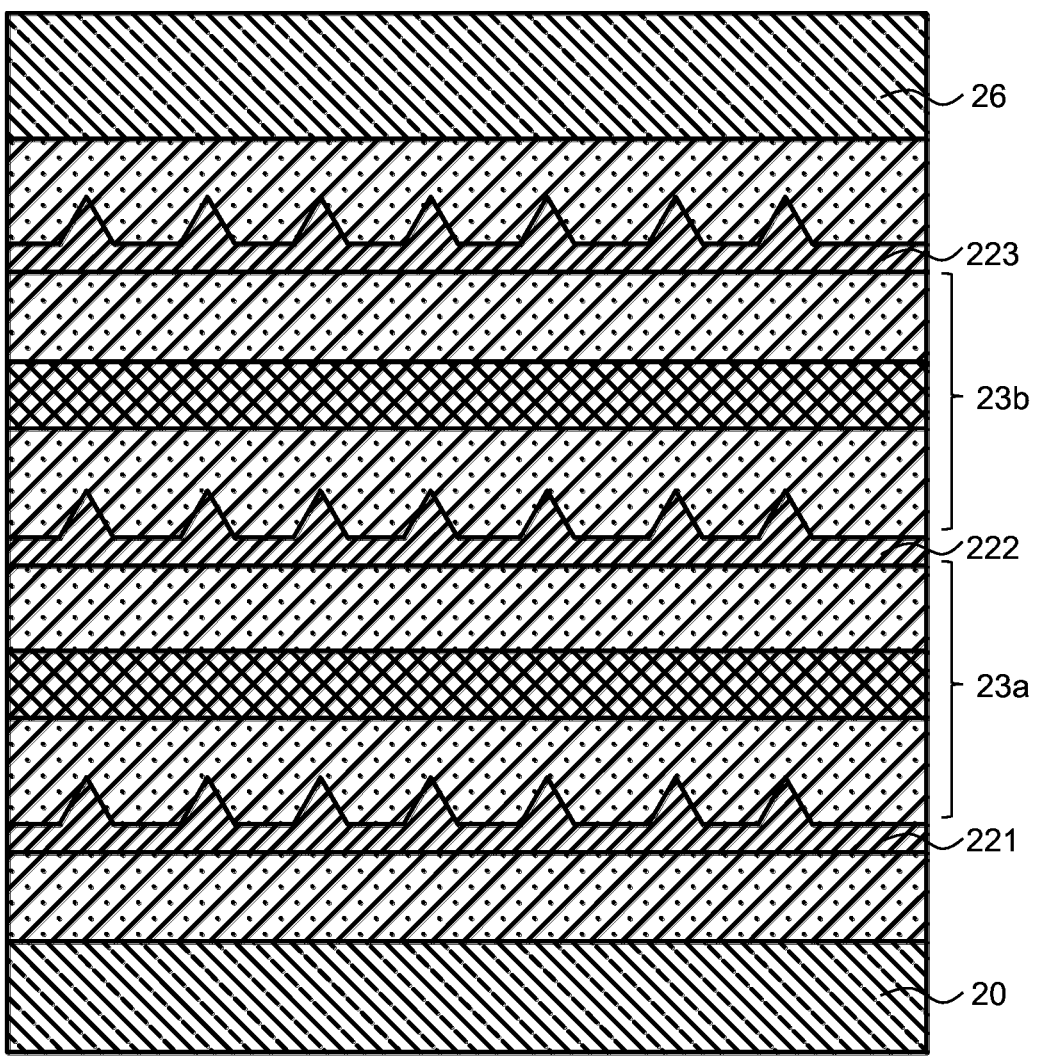
FIG. 2 depicts a schematic view of a QDIP, in accordance with an example embodiment of the present disclosure.

FIG. 2 depicts a schematic view of a QDIP 2, in accordance with one embodiment of the present disclosure. The QDIP 2 is similar to the QDIP 1 of FIG. 1 in that both comprise contact layers, a quantum well stack, and quantum dot layers. However, QDIP 2 comprises two quantum well stacks 23a, 23b and three quantum dot layers 221, 222, 223 disposed between two contact layers 20, 26. Each of the quantum well stacks 23a, 23b may be disposed between two of the quantum dot layers 221, 222, 223, i.e., as shown in FIG. 2, the quantum well stack 23a is disposed between the quantum dot layers 221, 222, and the quantum well stack 23b is disposed between the quantum dot layers 222, 223. The numbers of the stacks of quantum dot layers and quantum well stacks may be adjusted for demand and are not limited to only the above-mention configurations.

Figure 3A:
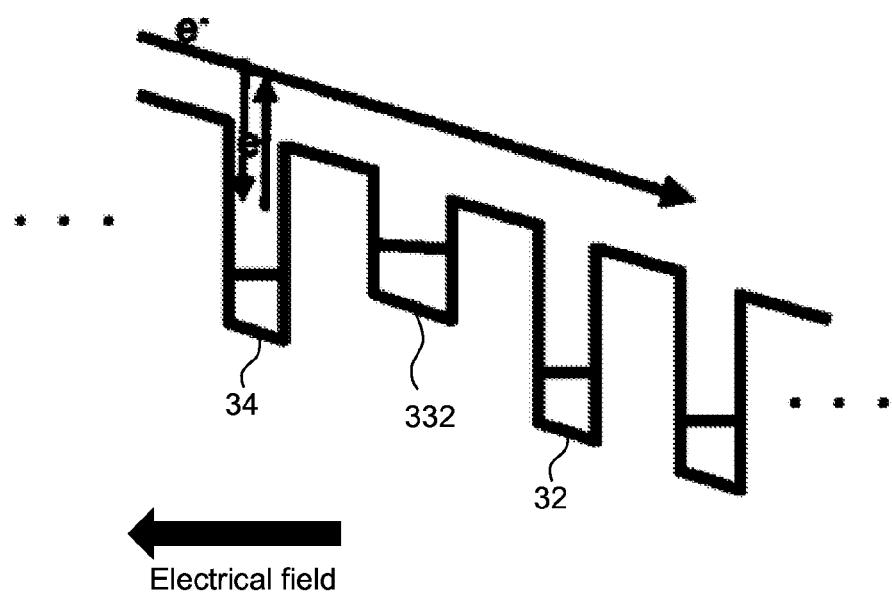
FIG. 3A depicts a working conduction energy band edge alignment diagram of a QDIP at 10 K under a lower bias voltage, in accordance with the embodiment depicted in FIG. 1 of the present disclosure.
Figure 3B:
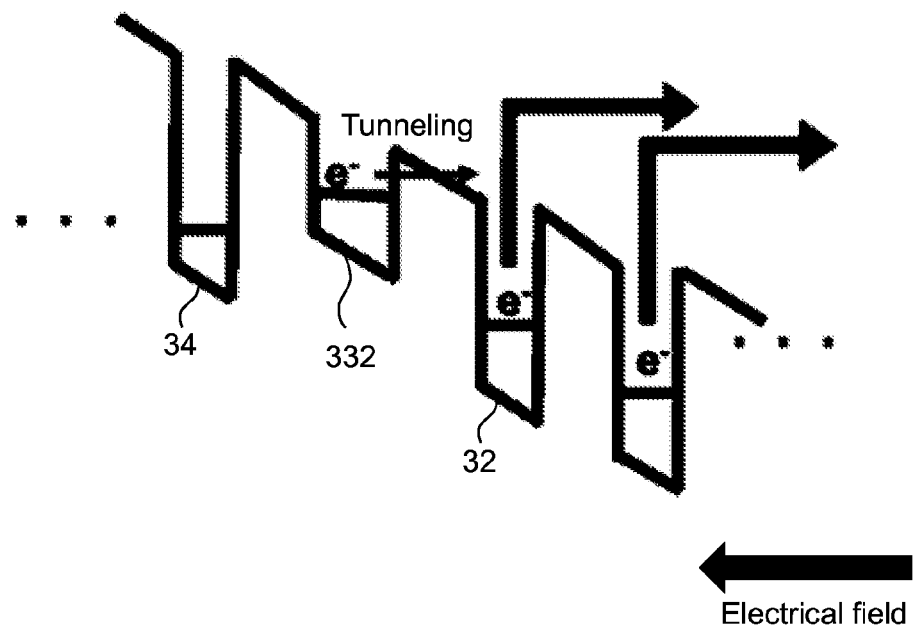
FIG. 3B depicts a working conduction energy band edge alignment diagram of the QDIP at 10 K under a higher bias voltage, in accordance with the embodiment depicted in FIG. 1 of the present disclosure.
Figure 4:
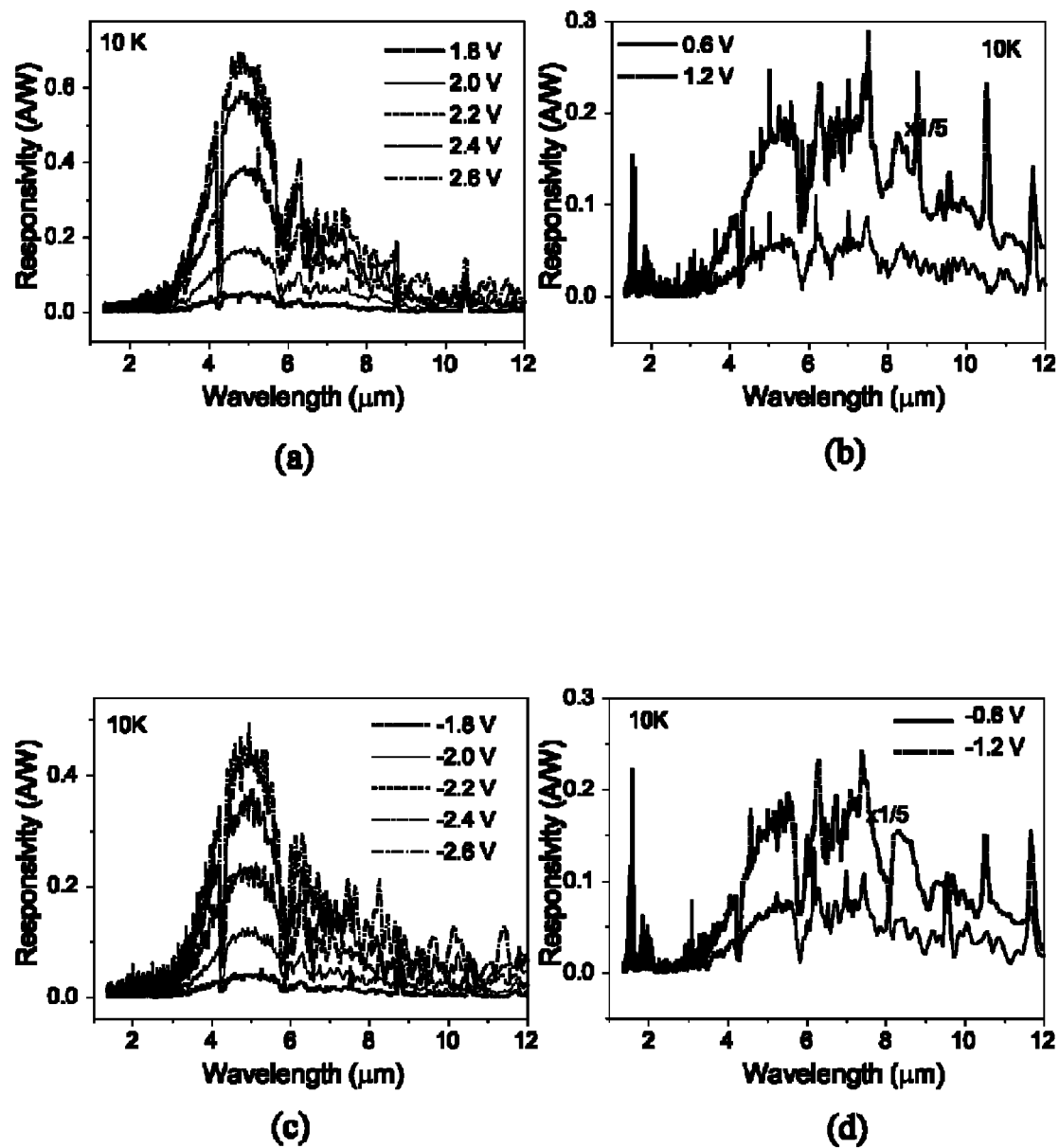
FIGS. 4(a)-(d) depict a responsivity spectra of the QDIP at 10 K under different bias voltages, including: (a) 1.8 to 2.6 V, (b) 0.6 to 1.2 V, (c) −1.8 to −2.6 V, and (d) −0.6 to −1.2 V, respectively, in accordance with embodiments of the present disclosure.

Referring now to FIGS. 3A and 3B in conjunction with FIGS. 4(a)-(d), FIG. 3A depicts a working conduction energy band edge alignment diagram of a QDIP at 10 K under a lower bias voltage, in accordance with the embodiment depicted in FIG. 1 of the present disclosure. FIG. 3B depicts a working conduction energy band edge alignment diagram of the QDIP at 10 K under a higher bias voltage, in accordance with the embodiment depicted in FIG. 1 of the present disclosure. FIGS. 4(a)-(d) depict responsivity spectra of the QDIP at 10 K under different bias voltages, including: (a) 1.8 to 2.6V, (b) 0.6 to 1.2 V, (c) −1.8 to −2.6 V, and (d) −0.6 to −1.2 V, respectively, in accordance with embodiments of the present disclosure. Due to the symmetric structure of the QDIP 1, the spectra measured with positive and negative bias voltages are similar. At 10 K, the bias voltages range from about 0.6 to 2.6 V and about −0.6 to −2.6 V. As shown in FIG. 3A, when the bias voltage is smaller than 1.2 V, the photo carriers are generated from the thermally excited electrons in the quantum dot layer 34, and the responsivity is small but contributes to all spectra ranges as shown in FIGS. 4(a) to 4(d). As shown in FIG. 3B, when the bias voltage is more than 1.8 V, extra carries are provided by the carrier supplying layer 332 of the quantum well stack to the adjacent quantum dot layer 32 with the aid of the thermal-assisted tunneling, and the much larger density of electrons in the quantum dot layer 32 results in a large ground to continuum transition in the spectral range of 4-6 μm, as shown in FIGS. 4(a) and 4(c).

FIGS. 5(a)-(d) depict responsivity spectra of the QDIP at different temperatures, including: (a) 77 K, (b) 130 K, (c) 1.2 V, and (d) 230 K, respectively, in accordance with embodiments of the present disclosure. In general, when an operating temperature increases, the thermal energy also increases the probability of the tunneling process to enhance the photocurrent continuously. Consequently, at a higher temperature between about 130 and 170 K, the signals could be detected even at low bias voltages, i.e., 0.2 and 0.4 V, as shown in FIGS. 5(b) and 5(c). Furthermore, as the temperature increases, it can be seen that the signals at 4-6 μm are larger than those at 6-10 μm, as shown in FIG. 5(d). It suggests that the carriers may be sufficiently supplied from the carrier supplying layer to the ground states of quantum dot layer. On the other hand, the dark current also increases rapidly at high temperatures.

Figure 5:
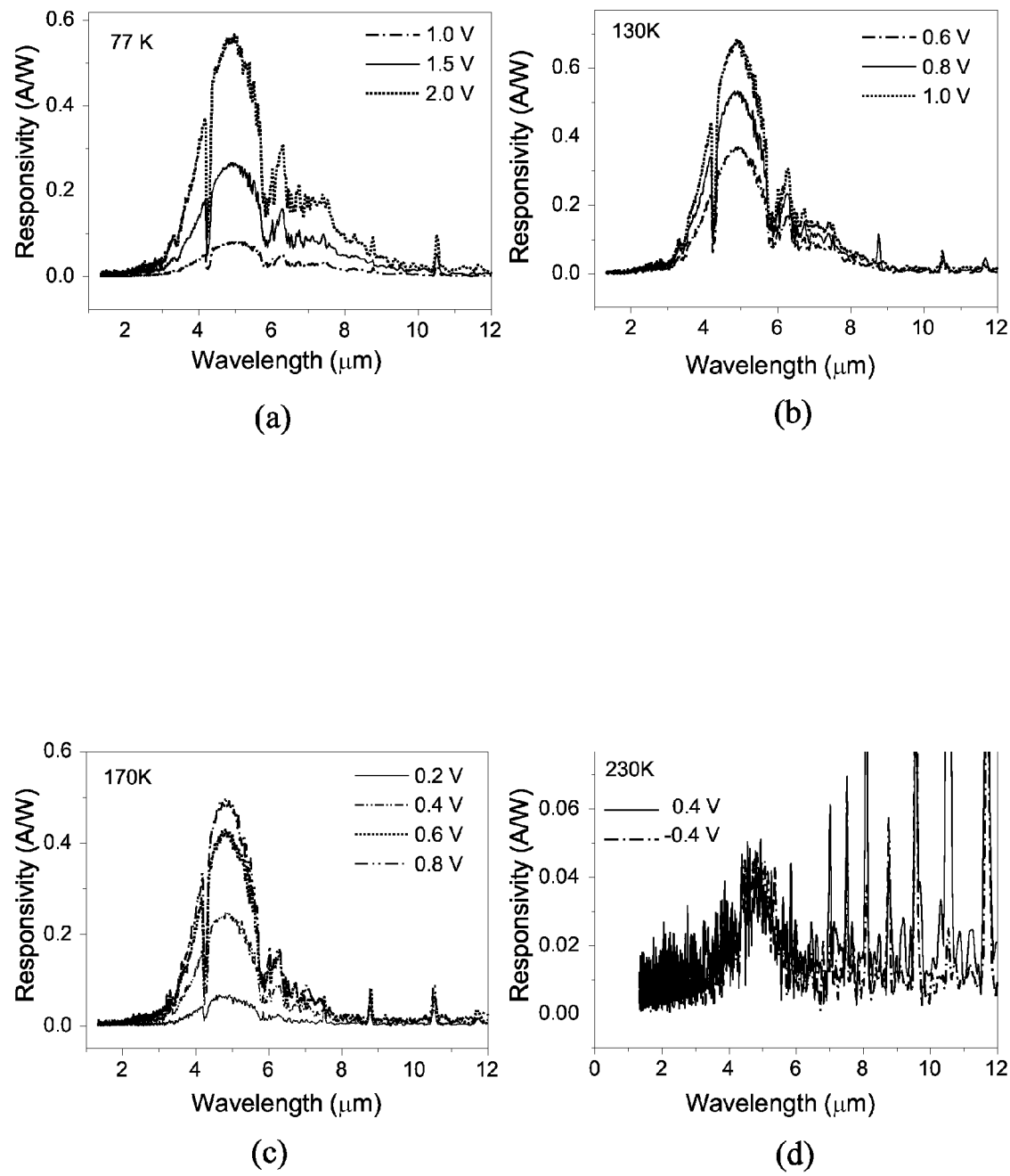
FIGS. 5(a)-(d) depict responsivity spectra of the QDIP at different temperatures, including: (a) 77 K, (b) 130 K, (c) 1.2 V, and (d) 230 K, respectively, in accordance with embodiments of the present disclosure.
Figure 6:
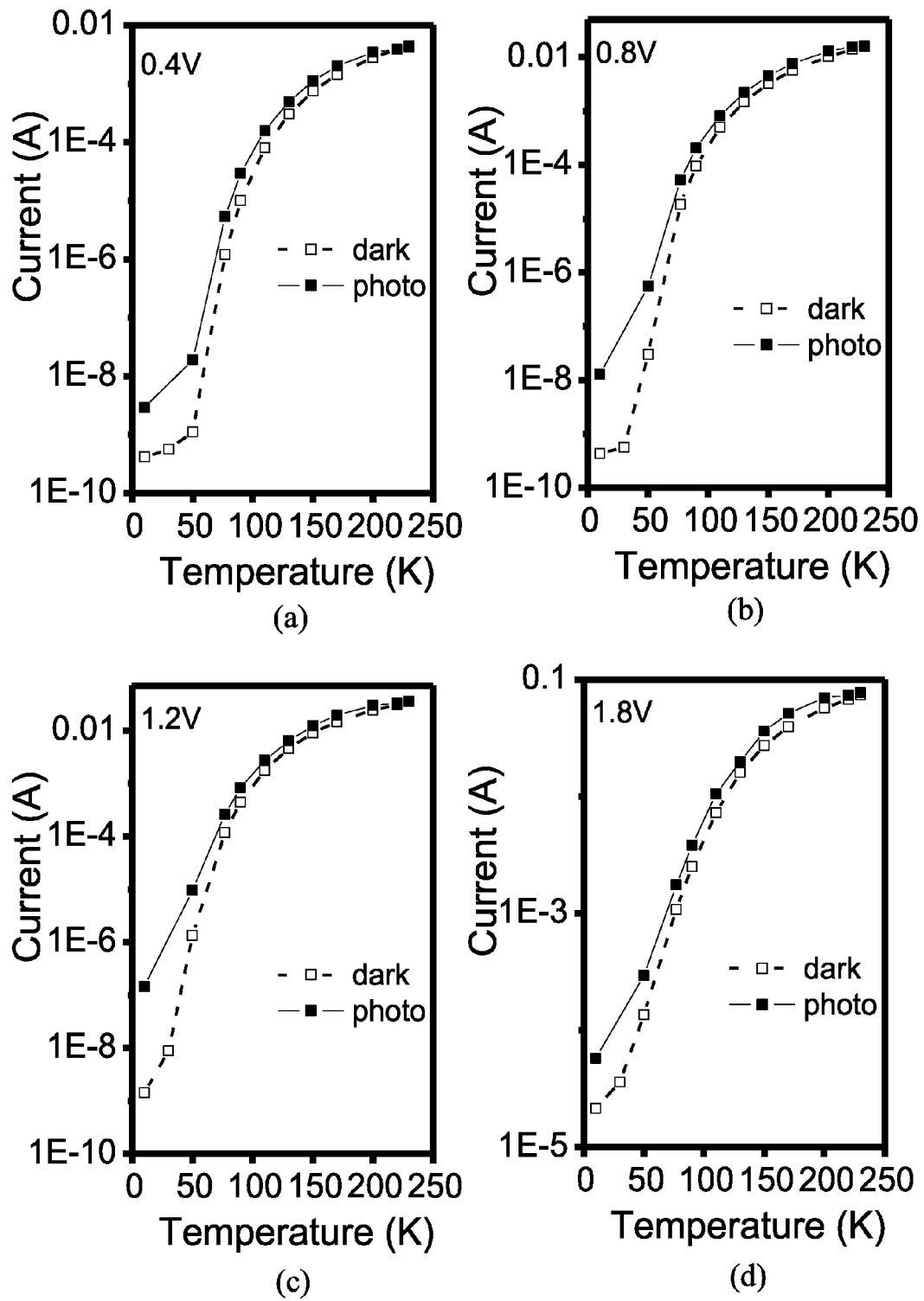
FIGS. 6(a)-(d) depict photocurrent and dark current curves of the QDIP from 10 to 230 K at different bias voltages, including: (a) 0.4 V, (b) 0.8 V, (c) 1.2 V, and (d) 1.8 V, respectively, in accordance with embodiments of the present disclosure.
Figure 7:
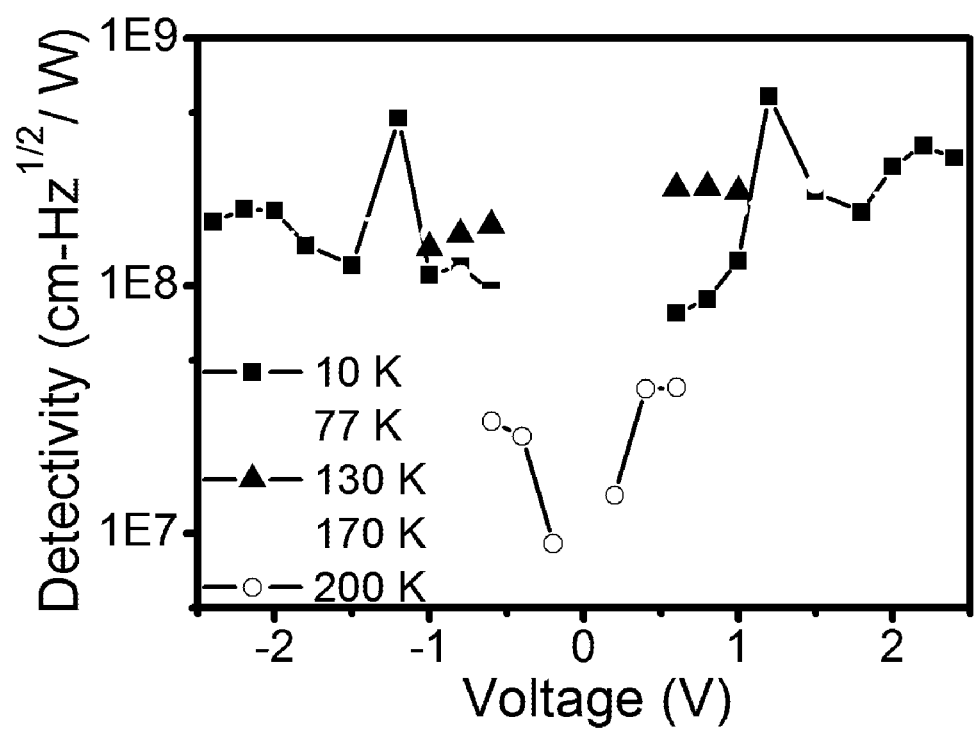
FIG. 7 depicts a detectivity of the QDIP with bias voltage at different temperatures, in accordance with one embodiment of the present disclosure.

FIGS. 6(a)-(d) depict photocurrent and dark current curves of the QDIP from 10 to 230 K at different bias voltages, including: (a) 0.4 V, (b) 0.8 V, (c) 1.2 V, and (d) 1.8 V, respectively, in accordance with embodiments of the present disclosure. FIG. 7 depicts detectivity of the QDIP with bias voltage at different temperatures, in accordance with one embodiment of the present disclosure. In contrast with the traditional concept of lowering the dark current in order to achieve high temperature operation, the current disclosure increases the photocurrent and keeps it larger than the dark current at high temperatures in order to enhance the operation temperature, which can be shown by measuring the dark and photocurrent from 10 to 230 K under different bias voltages, such as 0.4, 0.8, 1.2 and 1.8 V as shown in FIGS. 6($a$), 6($b$), 6($c$) and 6($d$), respectively. The photocurrent may be measured from about 10 to 230 K under illumination of 300 K blackbody radiation from its surroundings. As shown in FIGS. 6($a$)-($d$), the photocurrent is larger than dark current from 10 to 230 K, which results in larger peak responsivity at high temperatures. At 130 K, the peak responsivity may be 0.67 mA/W at 1.0 V and at 170 K, it is 0.49 mA/W at 0.8 V, as shown in FIGS. 5($b$) and 5($c$) respectively. Therefore, the QDIP 1 with the quantum well stack in quantum dot layers may be operated at 230 K with high responsivity of 0.046 mA/W at 0.4 V as shown in FIG. 5($d$), and the detectivity may be achieved to $$1.26 \times 10^7 \text{ cmHz}^{\frac{1}{2}}/W,$$

as shown in FIG. 7, which illustrates detectivity of the quantum dot infrared photodetector with bias voltage at different temperatures. From 10 to 130 K, the detectivity is larger than $$10^8 \text{ cmHz}^{\frac{1}{2}}/W$$

for the contribution of the carrier supplying layer to enhance the responsivity. In particular, at 200 K, although the dark current is large, the detectivity does not drop rapidly for the photocurrent supplement, which contributes to high responsivity to keep the detectivity at $$10^7 \text{ cmHz}^{\frac{1}{2}}/W.$$

As disclosed, a quantum well stack in quantum dot layers QDIP structure (WD-QDIPs) may be fabricated that can be operated at about 230 K. In contrast with the traditional concept of reducing the dark current, the present disclosure increases the to photocurrent by inserting the carrier supplying layer into the quantum dot layers. By optimizing the device parameters such as the spacer layer thickness, the doping concentration for the carrier supplying layer, the number of quantum well stacks and their location, WD-QDIPs may be operated at room temperature.

Realizations in accordance with the present disclosure have been described in the context of particular embodiments. These embodiments are meant to be illustrative and not limiting. Many variations, modifications, additions, and improvements are possible. Accordingly, plural instances may be provided for components described herein as a single instance. Structures and functionality presented as discrete components in the exemplary configurations may be implemented as a combined structure or component. These and other variations, modifications, additions, and improvements may fall within the scope of the invention as defined in the claims that follow.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Field of the Disclosure," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

What is claimed is:

1. A quantum dot infrared photodetector, comprising:
   two contact layers disposed opposite to each other;
   a plurality of quantum dot layers, disposed between the two contact layers; and
   at least one quantum well stack, disposed between the quantum dot layers;
   wherein the quantum well stack comprises two first spacer layers and a carrier supplying layer disposed between the first spacer layers, the conduction energy band edge alignment of the carrier supplying layer is lower than the conduction energy band edge alignments of the first spacer layers and is higher than the conduction energy band edge alignments of the quantum dot layers;
   two second spacer layers disposed inside the contact layers;
   the quantum dot layers disposed inside the second spacer layers;
   wherein when the contact layers are applied with two bias voltages respectively, the carrier supplying layer supplies carriers to the quantum dot layers;
   wherein the first spacer layers and the second spacer layers are the same material and be made of either undoped GaAs or InGaAs.

2. The quantum dot infrared photodetector according to claim 1, wherein the carrier supplying layer is doped with n-type dopants.

3. The quantum dot infrared photodetector according to claim 2, wherein the n-type dopants comprise Si.

4. The quantum dot infrared photodetector according to claim 3, wherein the concentration of the Si dopants is between about $9 \times 10^{17}$ cm$^{-3}$ and about $1 \times 10^{16}$ cm$^{-3}$.

5. The quantum dot infrared photodetector according to claim 1, wherein the carrier supplying layer comprises InGaAs, GaAs, InGaAsP, or AlInGaAs.

6. The quantum dot infrared photodetector according to claim 1, wherein the quantum dot layers comprise InAs or InGaAs.

7. The quantum dot infrared photodetector according to claim 1, wherein the contact layers are doped with n-type dopants.

8. The quantum dot infrared photodetector according to claim 7, wherein the contact layers comprise GaAs, InGaAsP, or InAlGaAs.

9. The quantum dot infrared photodetector according to claim 1, further comprising at least one blocking layer disposed between the second spacer layers and the contact layers.

10. The quantum dot infrared photodetector according to claim 1, wherein the number of stacks of the quantum dot layer/first spacer layer is three, five, or ten stacks.

11. A quantum dot infrared photodetector, comprising:
a first contact layer and a second contact layer disposed opposite to each other;
a quantum dot layer, disposed between the first and second contact layers; and
a n-doped layer cladded by two undoped spacer layers, and a quantum well stack is composed of the n-doped layer and the two undoped spacer layers, the conduction energy band edge alignment of the n-doped layer is lower than the conduction energy band edge alignments of the neighboring undoped spacer layers, the conduction energy band edge alignment of the n-doped layer is higher than the conduction energy band edge alignment of the quantum dot layer;
two spacer layers disposed inside the first and second contact layers;
the quantum dot layer disposed inside the spacer layers;
wherein the n-doped layer is disposed between the first contact layer and the quantum dot layer or between the second contact layer and the quantum dot layer;
wherein when the first and second contact layers are applied with two bias voltages, the n-doped layer supplies carriers to the quantum dot layer;
wherein the two undoped spacer layers comprise undoped GaAs or InGaAs, and the two spacer layers comprise GaAs or InGaAs.

12. The quantum dot infrared photodetector according to claim 11, wherein the n-doped layer comprises Si dopants.

13. The quantum dot infrared photodetector according to claim 12, wherein the concentration of the Si dopants is between $9 \times 10^{17}$ cm$^{-3}$ and $1 \times 10^{17}$ cm$^{-3}$.

14. The quantum dot infrared photodetector according to claim 11, wherein the n-doped layer comprises InGaAs, GaAs, InGaAsP, or AlInGaAs.

15. The quantum dot infrared photodetector according to claim 11, wherein the quantum dot layer comprises InAs.

16. The quantum dot infrared photodetector according to claim 11, wherein the first and second contact layers are doped with n-type dopants.

17. The quantum dot infrared photodetector according to claim 16, wherein the first and second contact layers comprise GaAs, InGaAsP, or InAlGaAs.

18. The quantum dot infrared photodetector according to claim 11, further comprising at least one blocking layer disposed between the spacer layer and the first contact layer or between the spacer layer and the second contact layer.

19. The quantum dot infrared photodetector according to claim 11, wherein the number of stacks of the quantum dot layer/ spacer layer is three, five, or ten stacks.

* * * * *